(12) United States Patent
Kim et al.

(10) Patent No.: US 6,456,612 B1
(45) Date of Patent: Sep. 24, 2002

(54) DEVICE AND METHOD FOR GENERATING SHORT PN CODE IN A MOBILE COMMUNICATION SYSTEM

(75) Inventors: Jae-Yoel Kim, Kunpo; Hi Chan Moon; Jae-Min Ahn, both of Seoul, all of (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/432,866

(22) Filed: Nov. 2, 1999

(30) Foreign Application Priority Data

Nov. 2, 1998 (KR) ......................................... 1998-47240

(51) Int. Cl.[7] .............................................. H04B 15/00
(52) U.S. Cl. ..................... 370/342; 370/206; 370/208; 375/140; 375/142; 375/143; 375/150; 375/152; 375/146
(58) Field of Search ................................ 370/208, 209, 370/206, 320, 335, 342; 375/130, 140–146, 150, 152, 343

(56) References Cited

U.S. PATENT DOCUMENTS 5,521,938 A * 5/1996 Stewart et al. ............... 375/130
6,038,249 A * 3/2000 Akiyama ..................... 375/130

* cited by examiner

Primary Examiner—Doris H. To
(74) Attorney, Agent, or Firm—Dilworth & Barrese, LLP

(57) ABSTRACT

A short PN code generating device in a mobile communication network having a N× CDMA communication system performing spreading at an N× chip rate using a short PN code of chip length $N \times 2^k$ and a 1× CDMA communication system performing spreading at a 1× chip rate using a short PN code of chip length $2^k$. The device generates a short PN code such that the N× CDMA communication system can distinguish at least the same number of base stations as the 1× CDMA communication system can distinguish. The device includes a sequence generator for generating an m-sequence having a chip length longer than the chip length $N \times 2^k$ to output an I-component short PN code; and a short PN code generator for switching the generated m-sequence at predetermined chip periods to alternately output the m-sequence as an I-component short PN code and a Q-component short PN code.

21 Claims, 3 Drawing Sheets

DEVICE AND METHOD FOR GENERATING SHORT PN CODE IN A MOBILE COMMUNICATION SYSTEM

PRIORITY

This application claims priority to an application entitled "Device and Method for Generating Short PN Code in Mobile Communication System" filed in the Korean Industrial Property Office on Nov. 2, 1998 and assigned Ser. No. 98-47240, the contents of which are hereby incorporated by reference.

BACKGROUND OF THE INVENTION

1. Field of the Invention

The present invention relates generally to a short PN code generation device and method for a CDMA mobile communication system, and, in particular, to a device and method for generating a short PN code for a high-speed mobile communication system.

2. Description of the Related Art

In general, CDMA (Code Division Multiple Access) mobile communication systems use orthogonal codes, long PN (Pseudo Noise) codes and short PN codes. The short PN codes are used to identify the base stations. For example, the forward link of the IS-95/IS-95A CDMA communication system identifies the base stations by using offsets to short PN codes.

The IS-95/IS-95A forward link uses a short PN code of length $2^{15}$ to identify the base stations. The respective base stations and mobile stations generate the short PN code of length $2^{15}$ in such a manner that while one base station generates the t-th chip of the short PN code, another base station generates a (t+(64*k))-th chip of the short PN code. A "chip" is an individual binary digit in the short PN code. Herein, "(64*k)" will be referred to as an offset. Therefore, the base stations use unique short PN codes each having different offset values to identify themselves. The mobile stations then identify the base stations by searching for the offsets of the short PN codes from the base stations. That is, the mobile stations identify the base stations depending on the offset values of the received short PN codes.

FIG. 1 shows a base station device for spreading a transmission signal using a short PN code of length $2^{15}$ in a conventional CDMA mobile communication system. In. FIG. 1, the finally output code unit is a chip. The existing CDMA mobile communication system generates 1.2288M chips per second for the short PN code, and the clock rate of the generated short PN code is equal to a chip rate.

Referring to FIG. 1, multipliers 111 and 113 commonly receive an orthogonally spread signal which was multiplied by an orthogonal code (such as a Walsh code). The multiplier 111 multiplies an I-component short PN code by the orthogonally spread signal, and the multiplier 113 multiplies a Q-component short PN code by the orthogonally spread signal. Here, the I-component short PN code and the Q-component short PN code are created so that the base station has a unique offset. A baseband filter 115 filters a baseband signal from the I-channel spread signal output from the multiplier 111, and a baseband filter 117 filters a baseband signal from the Q-channel spread signal output from the multiplier 113. A mixer 119 mixes an output of the baseband filter 115 with a carrier $\cos(2\pi f_c t)$, and a mixer 121 mixes an output of the baseband filter 117 with a carrier $\sin(2\pi f_c t)$. An adder 123 adds an output of the mixer 119 and an output of the mixer 121.

However, in an IMT-2000 system, which is a third generation mobile communication system introducing a multi-carrier concept, it is expected that the chip rate will increase. With regard to the chip rate, the IS-95 communication system is termed a 1× system, while the IMT-2000 communication system can be extended up to a 3× system, a 6× system, a 9× system and a 12× system, including the legacy 1× system. In terms of chips per second, the 1× system has a chip rate of 1.2288 Mcps (chips per second), the 3× system has a chip rate of 3×1.2288 Mcps=3.6864 Mcps, the 6× system has a chip rate of 6×1.2288 Mcps=7.3728 Mcps, the 9× system has a chip rate of 9×1.2288 Mcps=11.0592 Mcps, and the 12× system has a chip rate of 12×1.2288 Mcps= 14.7456 Mcps. Accordingly, the 1× system operates at the chip rate as that of the existing CDMA mobile communication system, whereas other N× systems operate at a chip rate increased by N times. At this point, in the N× systems, the time period of each chip is decreased by N times. Therefore, if the N× system uses the same offset as in the 1× system, the time period of the offset will be decreased by N times. Accordingly, it is difficult for the mobile station to identify the base stations because it is hard to distinguish whether the short PN code signal is a multipath signal from the existing base station or a short PN code signal from another base station. Thus, it is required to increase the offset by N times. Therefore, if the N× system uses the short PN code having the same period as the short PN code used in the existing 1× system, the number of cases (or the number of offsets) for identifying the base stations is decreased by N times. Accordingly, there is required a short PN code of time period N×$2^{15}$ in order to have the same offset number as the existing CDMA mobile communication system.

The above stated short PN code is a PN sequence having a period of $2^k$. The 3× system requires a short PN code of period 3×$2^{15}$. However, there exists no PN sequence having this period. Up to date, a sequence having the 3 random sequence properties and satisfying the PN sequence having this period has not been found (see "Shift Register Sequences" by Solomon W. Golomb).

Therefore, there has been research on a method of generating a PN sequence of period $2^{17}$, and then using only part of the $2^{17}$ PN sequence in order to obtain the short PN code of period 3×$2^{15}$. Since the short PN codes of period 3×$2^{15}$ generated by this method do not have the 3 properties of the random sequences, every effort has been made to reduce the number of hardware gates in generating the I-component short PN code and the Q-component short PN code.

As described above, the short PN code used in the IS-95 system cannot be used in the IMT-2000 mobile communication system due to the decrease in size of the offsets. In addition, when the IMT-2000 communication system uses the same short PN code as the IS-95 system, an increased number of hardware gates are required to generate the short PN code.

SUMMARY OF THE INVENTION

It is, therefore, an object of the present invention to provide a device and method for generating I-component and Q-component short PN codes using a single short PN code generator in a CDMA mobile communication system.

It is another object of the present invention to provide a device and method for generating I-component and Q-component short PN codes by alternately switching a PN code generated from a single short PN code generator in a CDMA mobile communication system.

It is further another object of the present invention to provide a device and method for generating a short PN code that is longer in length than the short PN code used in an IS-95 system to generate I-component and Q-component short PN codes using the generated short PN code in a CDMA mobile communication system.

In accordance with one embodiment of the present invention, there is provided a short PN code generating device in a mobile communication network having a N× CDMA communication system performing spreading at an N× chip rate using a short PN code of chip length $N\times2^k$ and a 1× CDMA communication system performing spreading at a 1× chip rate using a short PN code of chip length $2^k$, wherein the device generates a short PN code such that the N× CDMA communication system can distinguish at least the same number of base stations as the 1× CDMA communication system can distinguish. The device comprises a sequence generator for generating an m-sequence having a chip length longer than the chip length $N\times2^k$ to output an I-component short PN code; and a Q-component short PN code generator for logically operating the parallel outputs of the sequence generator with associated masks and XORing the logically operated values to generate a Q-component short PN code, wherein the masks have specific values so that the Q-component short PN code maintains a predetermined chip period distance from the I-component short PN code.

In accordance with another embodiment of the present invention, there is provided a short PN code generating device in a mobile communication network having a N× CDMA communication system performing spreading at an N× chip rate using a short PN code of chip length $N\times2^k$ and a 1× CDMA communication system performing spreading at a 1× chip rate using a short PN code of chip length $2^k$, wherein the device generates a short PN code such that the N× CDMA communication system can distinguish at least the same number of base stations as the 1× CDMA communication system can distinguish. The device comprises a sequence generator for generating an m-sequence having a chip length longer than the chip length $N\times2^k$ in order to output an I-component short PN code; and a short PN code generator for switching the generated m-sequence at predetermined chip periods in order to alternately output the m-sequence as an I-component short PN code and a Q-component short PN code.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Preferred embodiments of the present invention will be described herein below with reference to the accompanying drawings. In the following description, well-known functions or constructions are not described in detail since they would obscure the invention in unnecessary detail.

A CDMA mobile communication system according to an embodiment of the present invention generates I-component and Q-component short PN codes using a single short PN code generator with a reduced number of hardware gates.

Figure 1:
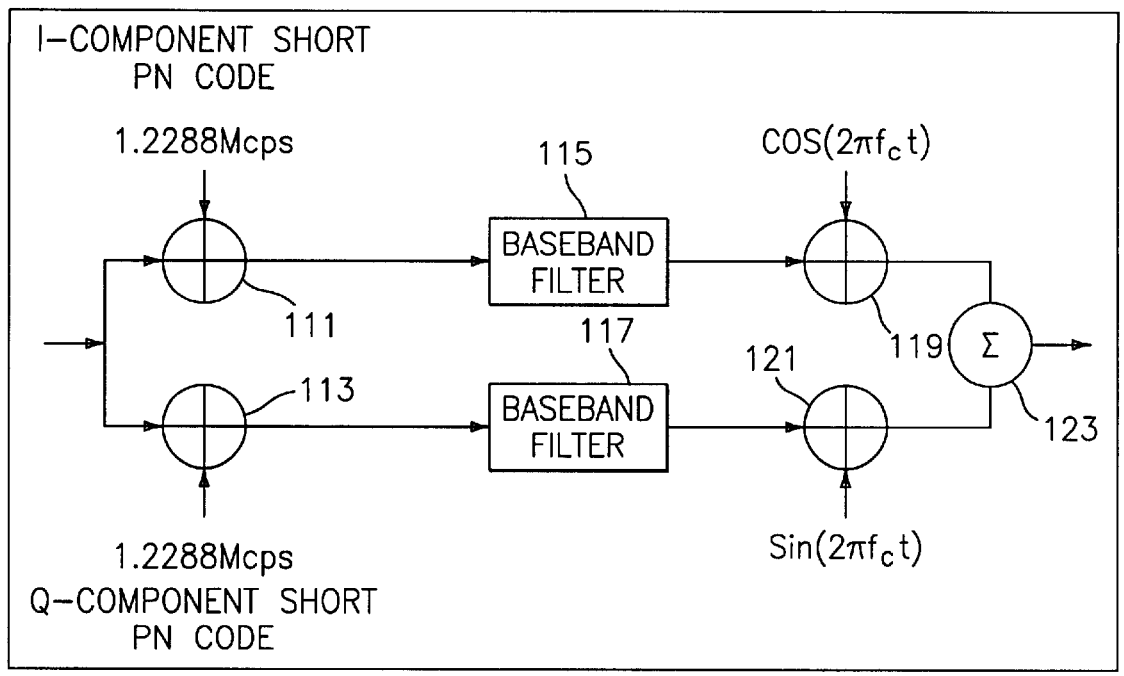
FIG. 1 is a diagram illustrating a base station device for spreading a transmission signal using a short PN code of period $2^{15}$ in a conventional CDMA mobile communication system.
Figure 2:
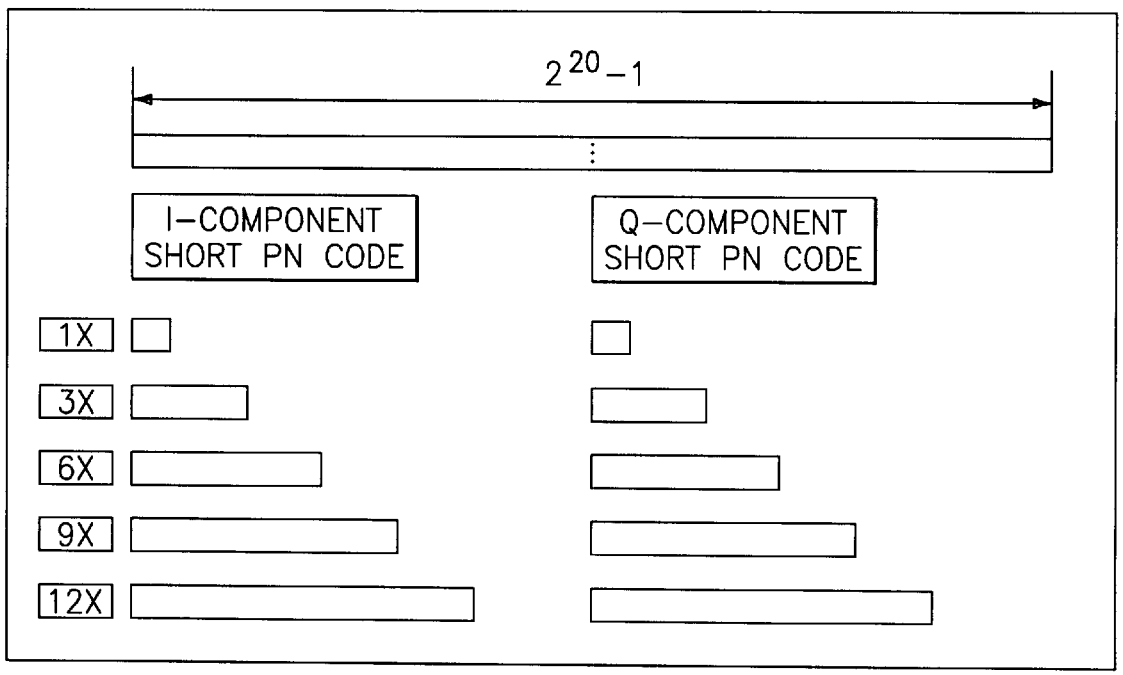
FIG. 2 is a diagram illustrating the concept of using a short PN code for a 1× system, 3× system, 6× system, 9× system and 12× system in an IMT-2000 CDMA mobile communication system.

FIG. 2 shows the concept of using a short PN code for a 1× system, 3× system, 6× system, 9× system and 12× system in an IMT-2000 system proposed by Qualcomm Co., U.S.A. Referring to FIG. 2, a short PN code of whole length $2^{20}-1$ is first generated, as shown on top. Then, for the 1× system, a $2^{15}$ ($1\times2^{15}$) sized section beginning at the head of the short PN code is used for the I-component short PN code and a $2^{15}$ sized section beginning at the middle of the short PN code is used for the Q-component short PN code. For the 3× system, a $3\times2^{15}$ sized section beginning at the head of the short PN code is used for the I-component short PN code and a $3\times2^{15}$ sized section beginning at the middle of the short PN code is used for the Q-component short PN code. For the 6× system, a $6\times2^{15}$ sized section beginning at the head of the short PN code is used for the I-component short PN code and a $6\times2^{15}$ sized section beginning at the middle of the short PN code is used for the Q-component short PN code. For the 9× system, a $9\times2^{15}$ sized section beginning at the head of the short PN code is used for the I-component short PN code and a $9\times2^{15}$ sized section beginning at the middle of the short PN code is used for the Q-component short PN code. For the 12× system, a $12\times2^{15}$ sized section beginning at the head of the short PN code is used for the I-component short PN code and a $12\times2^{15}$ section beginning at the middle of the short PN code is used for the Q-component short PN code.

A. First Embodiment

Figure 3:
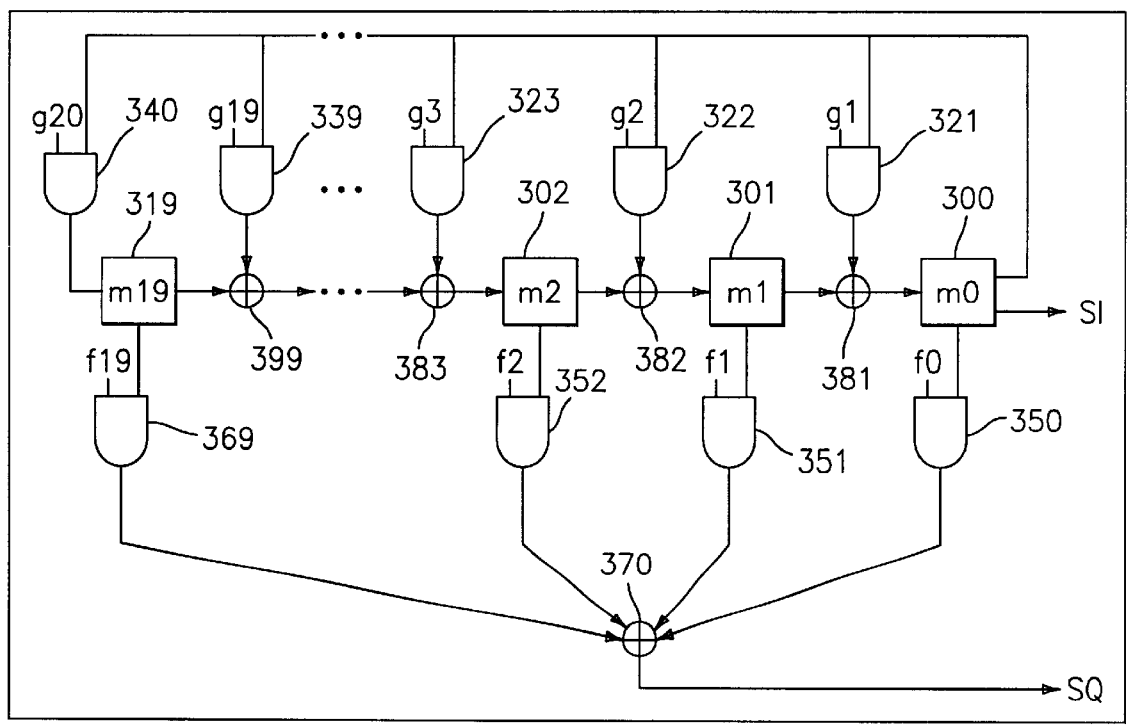
FIG. 3 is a diagram illustrating a short PN code generating device according to a first embodiment of the present invention in a CDMA mobile communication system.

FIG. 3 shows a short PN code generating device for implementing the concept of FIG. 2, in a CDMA mobile communication system according to a first embodiment of the present invention. In the first embodiment, it will be assumed that the short PN code has a length of $2^{20}-1$ and thus, the short PN code generating device includes 20 memories. The novel short PN code generating device of FIG. 3 is a short PN code generating device for use in an N× system, in which the $N\times2^{15}$ chip period beginning at the head of the generated full-length short PN code of length $2^{20}-1$ is generated as the I-component short PN code and the $N\times2^{15}$ chip period beginning at the middle of the full-length short PN code is generated as the Q-component short PN code. Therefore, the full-length short PN code should have a length longer than $2N\times2^{15}$ in length. The short PN code generated in the first embodiment is preferably an m-sequence.

Referring to FIG. 3, first of all, a value m19 of a memory 319 is initialized to '1' and the values m0–m18 of other memories 300–318 are all initialized to '0'. The values m0–m19 of the memories 300–319 are ORed with masks f0–f19 by OR gates 350–369, respectively. Outputs of the OR gates 350–369 are XORed by an XOR gate 370 to output a Q-component short PN code SQ. Here, the masks f0–f19 are set such that the parallel signals output from the memories 300–319 become the middle part of the generated short PN code. That is, the masks f0–f19 are used to isolate the short PN codes output from the memories 300–319 from the presently generated short PN code by $(2^{20}-1)/2$ so that the short PN codes are generated beginning at the middle.

In addition, the value m0 of the memory 300 is output as an I-component short PN code SI, and is commonly input to OR gates 321–340. The value m0 of the memory 300 is ORed with a coefficient g1 of a polynomial generator by the OR gate 321. An output of the OR gate 321 is XORed with the value m1 of the memory 301 by an XOR gate 381 and then stored as the value m0 in the memory 300. Further, the value m0 of the memory 300 is ORed with a coefficient g2 of the polynomial generator by the OR gate 322. An output of the OR gate 322 is XORed with the value m2 of the memory 302 by an XOR gate 382 and then stored as the value m1 in the memory 301. The value m0 of the memory 300 is ORed with a coefficient g3 of the polynomial generator by the OR gate 323. An output of the OR gate 323 is XORed with the value m3 of the next memory by an XOR gate 383 and then stored as the value m2 in the memory 302. In the same manner, the value m0 of the memory 300 is ORed with a coefficient g20 of the polynomial generator by the OR gate 340. An output of the OR gate 340 is stored as the value m19 in the memory 319. In this manner, the new values m0–m19 are stored in the memories 300–319.

The values m0–m19 output from the memories 300–319 are ORed with the associated mask values f0–f19 by the OR gates 350–369, respectively. The XOR gate 370 then XORs the outputs of the OR gates 350–369 to generate the Q-component short PN code. That is, the masks f0–f19 are the values for determining the middle chip position of the short PN code having the length shown in FIG. 2. Therefore, the XOR gate 370 has the function of generating the Q-component short PN code beginning at the middle of the full-length short PN code, as shown in FIG. 2.

The above short PN code generating procedure is repeated each chip period. Therefore, when a chip clock is generated, the short PN code generator repeats the above procedure to generate a short PN code having the full length of $2^{20}-1$, and the memories 300–319 store new values m0–m19. The short PN code generator according to the first embodiment simultaneously generates the I-component short PN code and the Q-component short PN code, which have the characteristics shown in FIG. 2. To this end, the specific mask values f0–f19 are used to ensure the Q-component short PN code begins at the middle of the full-length short PN code, as shown in FIG. 2.

In FIG. 3, the OR gates 321–340, the memories 300–319 and the XOR gates 381–399 constitute the short PN code generator, and the chips located at the leading parts of the short PN code generated from the short PN code generator become the I-component short PN code shown in FIG. 2. Further, the OR gates 350–369 and the XOR gate 370 generate the chips located at the middle parts of the short PN codes as the Q-component short PN code.

The short PN code generator of FIG. 3 generates the short PN code on a $N \times 2^{15}$ chip length basis. Referring to FIG. 2, for the 3× system, a controller, not depicted in FIG. 2, of the short PN code generator initializes the memories 300–319 whenever the length of the short PN code becomes $3 \times 2^{15}$. In this case, the short PN code generator generates the I-component short PN code of length $3 \times 2^{15}$ and the XOR gate 370 generates the Q-component short PN code of length $3 \times 2^{15}$. In addition, for the 6× system, the undepicted controller of the short PN code generator initializes the memories 300–319 whenever the length of the short PN code becomes $6 \times 2^{15}$. In this case, the short PN code generator generates the I-component short PN code of length $6 \times 2^{15}$ and the XOR gate 370 generates the Q-component short PN code of length $6 \times 2^{15}$. In the same manner, for the 9× system and the 12× system, the undepicted controller of the short PN code generator initializes the memories 300–319 whenever the length of the short PN code becomes $9 \times 2^{15}$ and $12 \times 2^{15}$, respectively.

The short PN code generator for the N× system performs initialization when the short PN code of length $N \times 2^{15}$ has completely generated. In the initialization procedure, the value m19 of the memory 319 is initialized to '1' and the other values m0–m18 of the memories 300–318 are all initialized to '0'. After initialization, the above short PN code generating procedure is continued to generate the I-component and Q-component short PN codes of length $N \times 2^{15}$ for the N× system. Therefore, in the first embodiment, it is possible to simultaneously generate the I-component and Q-component short PN codes for the $N \times 2^{15}$ chip period.

B. Second Embodiment

Figure 4:
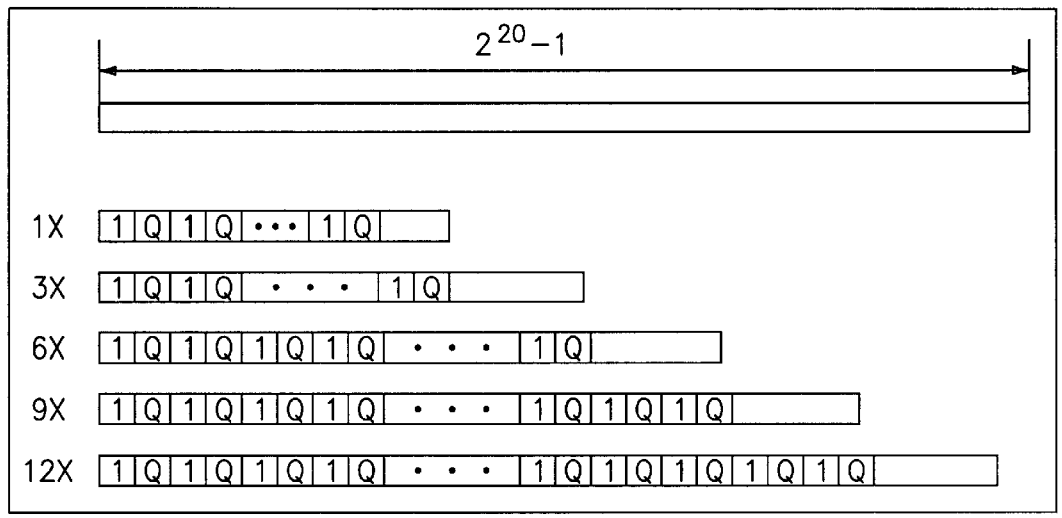
FIG. 4 is a diagram illustrating the concept of using a short PN code according to a second embodiment of the present invention in a CDMA mobile communication system.

FIG. 4 shows the concept of generating a short PN code according to a second embodiment of the present invention in a CDMA mobile communication system. In the second embodiment, it will be assumed that the full length of the generated short PN code is $2^{20}-1$. The short PN code generated in the second embodiment is preferably an m-sequence.

Referring to FIG. 4, the I-component and Q-component short PN codes are generated in such a manner that a first chip signal of the generated short PN code is output as the I-component short PN code, a second chip signal is output as the Q-component short PN code, a third chip signal is output as the I-component short PN code, and a fourth chip signal is output as the Q-component short PN code. That is, the short PN code generator, while continuously generating the short PN code of full length $2^{20}-1$, alternately outputs the generated short PN code as the I-component short PN code and the Q-component short PN code. In the short PN code generation method of FIG. 4, the Q-component short PN codes are generated alternating with the I-component short PN codes, rather than generated beginning at the middle of the short PN code generated from the short PN code generator as shown in FIG. 2. The short PN code generation method according to the second embodiment contributes to simplification of the hardware structure for generating the I-component and Q-component short PN codes using the single short PN code generator.

While FIG. 4 shows an example where the I-component and Q-component short PN codes are generated by switching the short PN code output from a single short PN code generator on a one-chip unit basis, it is also possible to generate the I-component and Q-component short PN codes by switching the short PN code on a multiple-chip unit basis. In addition, although FIG. 4 shows an example where the odd-numbered chips are generated as the I-component short PN code and the even-numbered chips are generated as the Q-component short PN code, it is also possible to generate the odd-numbered chips as the Q-component short PN code and the even-numbered chips as the I-component short PN code.

Figure 5:
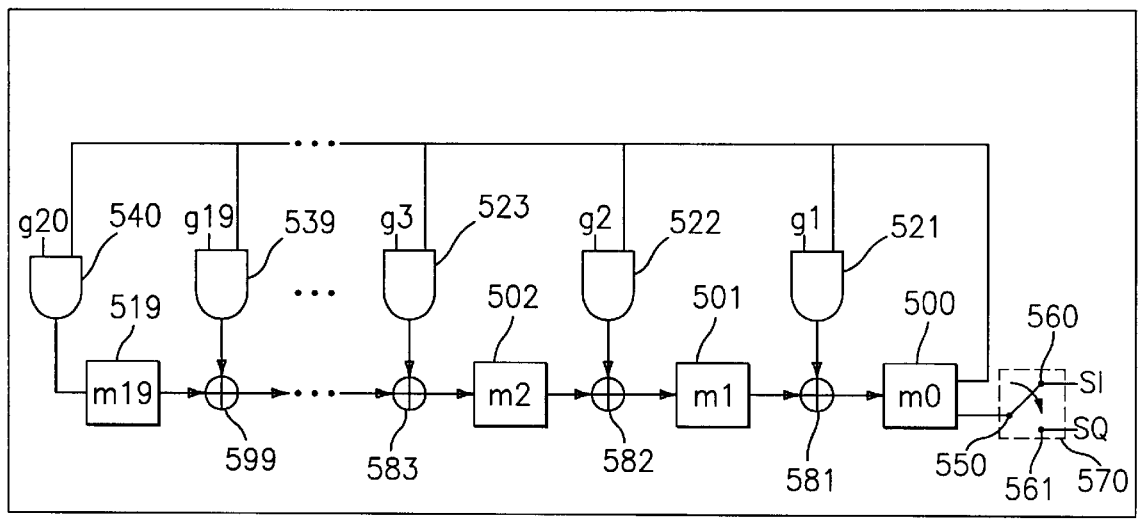
FIG. 5 is a diagram illustrating a short PN code generating device for implementing the short PN code generating method of FIG. 4.

FIG. 5 shows a short PN code generating device for implementing the short PN code generating method of FIG. 4. Herein, the short PN code generating device is assumed to include 20 memories.

Referring to FIG. 5, first of all, a value m19 of a memory 519 is initialized to '1' and values m0–m18 of other memories 500–518 are all initialized to '0'. At this point, a switch 570 is connected to a node 560 to output the value m0 of the memory 500 as the I-component short PN code SI. At the same time, the value m0 output from the memory 500 is commonly input to OR gates 521–540. The value m0 of the memory 500 is ORed with a coefficient g1 of a polynomial generator by the OR gate 521. An output of the OR gate 521 is XORed with the value m1 of the memory 501 by an XOR gate 581 and then stored as the value m0 in the memory 500. Further, the value m0 of the memory 500 is ORed with a coefficient g2 of the polynomial generator by the OR gate 522. An output of the OR gate 522 is XORed with the value m2 of the memory 502 by an XOR gate 582 and then stored as the value m1 in the memory 501. The value m0 of the memory 500 is ORed with a coefficient g3 of the polynomial generator by the OR gate 523. An output of the OR gate 523 is XORed with the value m3 of the next memory by an XOR gate 583 and then stored as the value m2 in the memory 502. In the same manner, the value m0 of the memory 500 is ORed with a coefficient g20 of the polynomial generator by the OR gate 540. An output of the OR gate 540 is stored as the value m19 in the memory 519. In this manner, the new values m0–m19 are stored in the memories 500–519.

The switch 570 is then connected to a node 561 to output the value m0 of the memory 500 as the Q-component short PN code SQ. At the same time, the value m0 output from the memory 500 is commonly input to OR gates 521–540. Then, the value m0 of the memory 500 is ORed with the coefficient g1 of the polynomial generator by the OR gate 521. An output of the OR gate 521 is XORed with the value m1 of the memory 501 by an XOR gate 581 and then stored as the value m0 in the memory 500. Further, the value m0 of the memory 500 is ORed with the coefficient g2 of the polynomial generator by the OR gate 522. An output of the OR gate 522 is XORed with the value m2 of the memory 502 by an XOR gate 582 and then stored as the value m1 in the memory 501. The value m0 of the memory 500 is ORed with the coefficient g3 of the polynomial generator by the OR gate 523. An output of the OR gate 523 is XORed with the value m3 of the next memory by an XOR gate 583 and then stored as the value m2 in the memory 502. In the same manner, the value m0 of the memory 500 is ORed with the coefficient g20 of the polynomial generator by the OR gate 540. An output of the OR gate 540 is stored as the value m19 in the memory 519. In this manner, the new values m0–m19 are stored in the memories 500–519.

The above procedure is repeated to alternately generate the I-component short PN code and the Q-component short PN code.

The Nx system initializes again the value m19 of the memory 519 to '1' and the values m0–m18 of the other memories 500–518 to '0' after the above operation is performed for $2 \times N \times 2^{15}$ chip period, and thereafter repeats the above procedure. In this manner, it is possible to generate the I-component and Q component short PN codes, each of length $N \times 2^{15}$. In addition, the switch 570 can be implemented by a demultiplexer.

The first embodiment generates the I-component and Q-component when the shift register circulates one time, whereas the second embodiment generates the I-component and Q-component when the shift register circulates two times. Therefore, in order to make the chip rate of the short PN code generated by the second embodiment be equal to the chip rate of the short PN code generated by the first embodiment, it is necessary to double the chip rate of the short PN code generated in the second embodiment. However, in terms of the number of gates included in the short PN code generator, the first embodiment includes the larger number of gates to generate the Q-component short PN code using the masks, as compared with the second embodiment.

As described above, a next generation mobile communication system having a chip rate higher by N times than the existing chip rate can generate short PN codes satisfying various chip rates while maintaining the number of offsets required when a mobile station identifies base stations. In addition, the novel short PN code generating device has a simple hardware structure.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A short PN (Pseudo Noise) code generating device in a mobile communication network having a Nx CDMA communication system performing spreading at an Nx chip rate using a short PN code of chip length $N \times 2^k$ and a 1x CDMA communication system performing spreading at a 1x chip rate using a short PN code of chip length $2^k$, wherein the device generates a short PN code such that the Nx CDMA communication system can distinguish at least the same number of base stations as the 1x CDMA communication system can distinguish, the device comprising:

a sequence generator for generating an m-sequence having a chip length longer than the chip length $N \times 2^k$ to output an I-component short PN code; and a Q-component short PN code generator for logically operating on parallel outputs of the sequence generator with associated masks and XORing the logically operated values to generate a Q-component short PN code, wherein the masks have specific values so that the Q-component short PN code maintains a predetermined chip period from the I-component short PN code.

2. The short PN code generating device as claimed in claim 1, wherein N is a multiple of 3 and k is 15.

3. The short PN code generating device as claimed in claim 2, further comprising a circuit for initializing the sequence generator when the sequence generator completes the generation of an m-sequence of chip length $N \times 2^k - 1$.

4. The short PN code generating device as claimed in claim 3, wherein the masks have specific values so that the predetermined chip period between the Q-component short PN code and the I-component short PN code is ½ the length of a full sequence generated from the sequence generator.

5. A short PN (Pseudo Noise) code generating device in a mobile communication network having a Nx CDMA communication system performing spreading at an Nx chip rate using a short PN code of chip length $N \times 2^k$ and a 1x CDMA communication system performing spreading at a 1x chip rate using a short PN code of chip length $2^k$, wherein the device generates a short PN code such that the Nx CDMA communication system can distinguish at least the same number of base stations as the 1x CDMA communication system can distinguish, the device comprising:

a sequence generator for generating an m-sequence having a chip length longer than the chip length $N \times 2^k$ to output an I-component short PN code; and a short PN code generator for switching the generated m-sequence at predetermined chip periods to alternately output the m-sequence as an I-component short PN code and a Q-component short PN code.

6. The short PN code generating device as claimed in claim 5, wherein the sequence generator generates an m-sequence having a chip length which is at least $2N \times 2^k$.

7. The short PN code generating device as claimed in claim 6, wherein the short PN code generator has a switching period of one chip, and generates the I-component and Q-component short PN codes of chip length $N \times 2^k$.

8. The short PN code generating device as claimed in claim 7, wherein the short PN code generator includes a demultiplexer.

9. The short PN code generating device as claimed in claim 6, further comprising a circuit for performing initialization after the sequence generator completely generates the at least $2N \times 2^k$ chips.

10. The short PN code generating device as claimed in claim 6, wherein N is a multiple of 3 and k is 15.

11. A short PN (Pseudo Noise) code generating method in a mobile communication network having a Nx CDMA communication system performing spreading at an Nx chip rate using a short PN code of chip length $N \times 2^k$ and a 1x CDMA communication system performing spreading at a 1x chip rate using a short PN code of chip length $2^k$, wherein the device generates a short PN code such that the Nx CDMA communication system can distinguish at least the same number of base stations as the 1x CDMA communication system can distinguish, the method comprising the steps of:

(a) generating a m-sequence having a chip length longer than the chip length $N \times 2^k$ to output an I-component short PN code; and (b) switching the generated m-sequence at predetermined chip periods to alternately output the m-sequence as an I-component short PN code and a Q-component short PN code.

12. The short PN code generating method as claimed in claim 11, wherein an m-sequence generated in step (a) has a chip length which is at least $2N \times 2^k$.

13. The short PN code generating method as claimed in claim 12, wherein in step (b), the switching period is a one-chip period and the I-component and Q-component short PN codes have a chip length of $N \times 2^k$.

14. The short PN code generating method as claimed in claim 11, further comprising the step of performing initialization after generating the m-sequence having a chip length longer than the chip length $N \times 2^k$ in step (a).

15. The short PN code generating method as claimed in claim 11, wherein N is a multiple of 3 and k is 15.

16. A short PN (Pseudo Noise) code generating method in a mobile communication network having a Nx CDMA communication system performing spreading at an Nx chip rate using a short PN code of chip length $N \times 2^k$ and a 1x CDMA communication system performing spreading at a 1x chip rate using a short PN code of chip length $2^k$, wherein the device generates a short PN code such that the Nx CDMA communication system can distinguish at least the same number of base stations as the 1x CDMA communication system can distinguish, the method comprising the steps of:

(a) generating a m-sequence having a chip length longer than the chip length $N \times 2^k$ to output an I-component short PN code; and (b) logically operating on parallel outputs of the m-sequence generator with associated masks by XORing the logically operated values to generate a Q-component short PN code, wherein the masks have specific values so that the Q-component short PN code maintains a predetermined chip period from the I-component short PN code.

17. The short PN code generating method as claimed in claim 16, wherein N is a multiple of 3 and k is 15.

18. The short PN code generating method as claimed in claim 16, further comprising a circuit for initializing the sequence generator when the sequence generator completes the generation of an m-sequence of chip length $N \times 2^k - 1$.

19. The short PN code generating method as claimed in claim 16, wherein the masks have specific values so that the predetermined chip period between the Q-component short PN code and the I-component short PN code is ½ the length of a full sequence generated from the sequence generator.

20. A short PN (Pseudo Noise) code generating device for a CDMA (Code Division Multiple Access) communication system, wherein the device generates a short PN code such that an Nx CDMA communication system performing spreading at an Nx chip rate using a short PN code of chip length $N \times 2^k$ can distinguish at least the same number of base stations as a 1x CDMA communication system performing spreading at a 1x chip rate using a short PN code of chip length $2^k$ can distinguish, the device comprising:

a sequence generator for generating an m-sequence having a chip length longer than the chip length $N \times 2^k$ to output an I-component short PN code; and a Q-component short PN code generator for logically operating on parallel outputs of the sequence generator with associated masks and XORing the logically operated values to generate a Q-component short PN code, wherein the masks have specific values so that the Q-component short PN code maintains a predetermined chip period from the I-component short PN code.

21. A short PN (Pseudo Noise) code generating device for a CDMA (Code Division Multiple Access) communication system, wherein the device generates a short PN code such that an Nx CDMA communication system performing spreading at an Nx chip rate using a short PN code of chip length $N \times 2^k$ can distinguish at least the same number of base stations as a 1x CDMA communication system performing spreading at a 1x chip rate using a short PN code of chip length $2^k$ can distinguish, the device comprising:

a sequence generator for generating an m-sequence having a chip length longer than the chip length $N \times 2^k$ to output an I-component short PN code; and a short PN code generator for switching the generated m-sequence at predetermined chip periods to alternately output the m-sequence as an I-component short PN code and a Q-component short PN code.

* * * * *